(12) United States Patent
Shen et al.

(10) Patent No.: US 11,908,857 B2
(45) Date of Patent: Feb. 20, 2024

(54) SEMICONDUCTOR DEVICES HAVING LATE-FORMED ISOLATION STRUCTURES

(71) Applicant: GLOBALFOUNDRIES U.S. Inc., Santa Clara, CA (US)

(72) Inventors: Yanping Shen, Saratoga Springs, NY (US); Haiting Wang, Clifton Park, NY (US); Sipeng Gu, Clifton Park, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 199 days.

(21) Appl. No.: 16/901,417

(22) Filed: Jun. 15, 2020

(65) Prior Publication Data

US 2021/0391323 A1 Dec. 16, 2021

(51) Int. Cl.
*H01L 27/088* (2006.01)
*H01L 21/8234* (2006.01)
*H01L 21/8238* (2006.01)

(52) U.S. Cl.
CPC .. *H01L 27/0886* (2013.01); *H01L 21/823437* (2013.01); *H01L 21/823468* (2013.01); *H01L 21/823481* (2013.01); *H01L 21/823878* (2013.01)

(58) Field of Classification Search
CPC ......... H01L 27/0886; H01L 21/823468; H01L 21/823481; H01L 21/823878
See application file for complete search history.

(56) References Cited

U.S. PATENT DOCUMENTS

| | | | |
|---|---|---|---|
| 7,964,893 B2 | 6/2011 | Lee | |
| 9,559,008 B2 | 1/2017 | Lin et al. | |
| 9,653,448 B2 | 5/2017 | Zhang et al. | |
| 9,653,583 B1* | 5/2017 | Zhao | H01L 29/66545 |
| 9,917,103 B1 | 3/2018 | Mulfinger et al. | |
| 2016/0254180 A1* | 9/2016 | Liu | H01L 29/0649 |
| | | | 257/369 |
| 2017/0012000 A1* | 1/2017 | Tseng | H01L 29/165 |
| 2017/0141211 A1 | 5/2017 | Xie et al. | |
| 2019/0067120 A1* | 2/2019 | Ching | H01L 27/0924 |
| 2019/0164952 A1* | 5/2019 | Chang | H01L 27/0266 |
| 2020/0343144 A1* | 10/2020 | Li | H01L 21/823481 |
| 2021/0036121 A1* | 2/2021 | Lim | H01L 29/78696 |

* cited by examiner

*Primary Examiner* — Tuan A Hoang
(74) *Attorney, Agent, or Firm* — Thompson Hine LLP; Francois Pagette

(57) ABSTRACT

Structures for a semiconductor device that include dielectric isolation and methods of forming a structure for a semiconductor device that includes dielectric isolation. A semiconductor body includes a cavity, first and second gate structures extending over the semiconductor body, and a semiconductor layer including first and second sections on the semiconductor body. The first section of the semiconductor layer is laterally positioned between the cavity and the first gate structure, and the second section on the semiconductor layer is laterally positioned between the cavity and the second gate structure. An isolation structure is laterally positioned between the first and second sections of the semiconductor layer. The isolation structure includes a dielectric layer and a sidewall spacer having first and second sections. The dielectric layer includes a first portion in the cavity and a second portion between the first and second sections of the sidewall spacer.

19 Claims, 11 Drawing Sheets

US 11,908,857 B2

SEMICONDUCTOR DEVICES HAVING LATE-FORMED ISOLATION STRUCTURES

BACKGROUND

The present invention relates to semiconductor device fabrication and integrated circuits and, more specifically, to structures for a semiconductor device that include dielectric isolation and methods of forming a structure for a semiconductor device that includes dielectric isolation.

Complementary-metal-oxide-semiconductor (CMOS) processes may be used to build a combination of p-type and n-type field-effect transistors that are used to construct, for example, logic cells. Field-effect transistors generally include a semiconductor body supplying a channel region in a substrate, a source, a drain, and a gate structure over the semiconductor body. When a control voltage exceeding a characteristic threshold voltage is applied to a gate electrode of the gate structure, carrier flow occurs in the channel region between the source and drain to produce a device output current.

A fin-type field-effect transistor (FinFET) is a non-planar device structure that may be more densely packed in an integrated circuit than a planar field-effect transistor. A fin-type field-effect transistor may include a fin providing a semiconductor body, a gate structure that wraps about the fin, and heavily-doped source/drain regions arranged on opposite sides of the gate structure. The source/drain regions may be epitaxially grown in cavities that are etched in the fin. In an application, fin-type field-effect transistor structures may be used to form diodes for an electrostatic discharge circuit.

Improved structures for a semiconductor device that include dielectric isolation and methods of forming a structure for a semiconductor device that includes dielectric isolation are needed.

SUMMARY

In an embodiment of the invention, a structure includes a semiconductor body having a cavity, a first gate structure and a second gate structure extending over the semiconductor body, and a semiconductor layer having a first section on the semiconductor body and a second section on the semiconductor body. The first section of the semiconductor layer is laterally positioned between the cavity and the first gate structure, and the second section of the semiconductor layer is laterally positioned between the cavity and the second gate structure. The structure includes an isolation structure laterally positioned between the first section and the second section of the semiconductor layer. The isolation structure including a dielectric layer and a sidewall spacer having a first section and a second section. The dielectric layer includes a first portion in the cavity and a second portion between the first section and the second section of the sidewall spacer.

In an embodiment of the invention, a method includes forming a cavity in a semiconductor body, forming a first gate structure and a second gate structure extending over the semiconductor body, forming a first section and a second section of a semiconductor layer on the semiconductor body, and forming an isolation structure laterally positioned between the first section and the second section of the semiconductor layer. The first section of the semiconductor layer is laterally positioned between the cavity and the first gate structure, and the second section of the semiconductor layer is laterally positioned between the cavity and the second gate structure. The isolation structure includes a dielectric layer and a sidewall spacer having a first section and a second section. The dielectric layer includes a first portion in the cavity and a second portion between the first section and the second section of the sidewall spacer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

FIG. 5A is a top view of the structure in which FIG. 5 is taken generally along line 5-5.

FIG. 6A is a top view of the structure in which FIG. 6 is taken generally along line 6-6.

DETAILED DESCRIPTION

Figure 1:
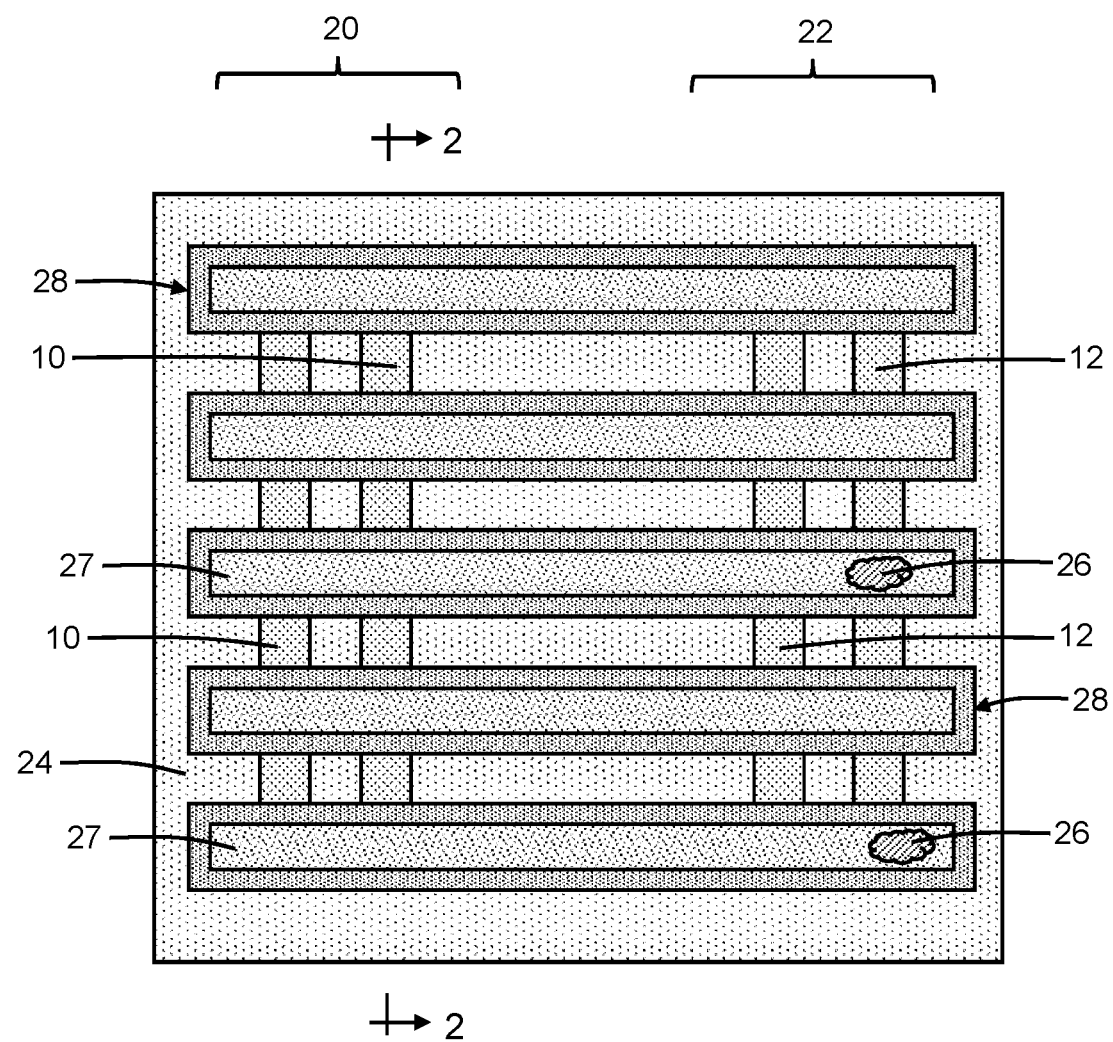
FIG. 1 is a top view of a structure at an initial fabrication stage of a processing method in accordance with embodiments of the invention.
Figure 2:
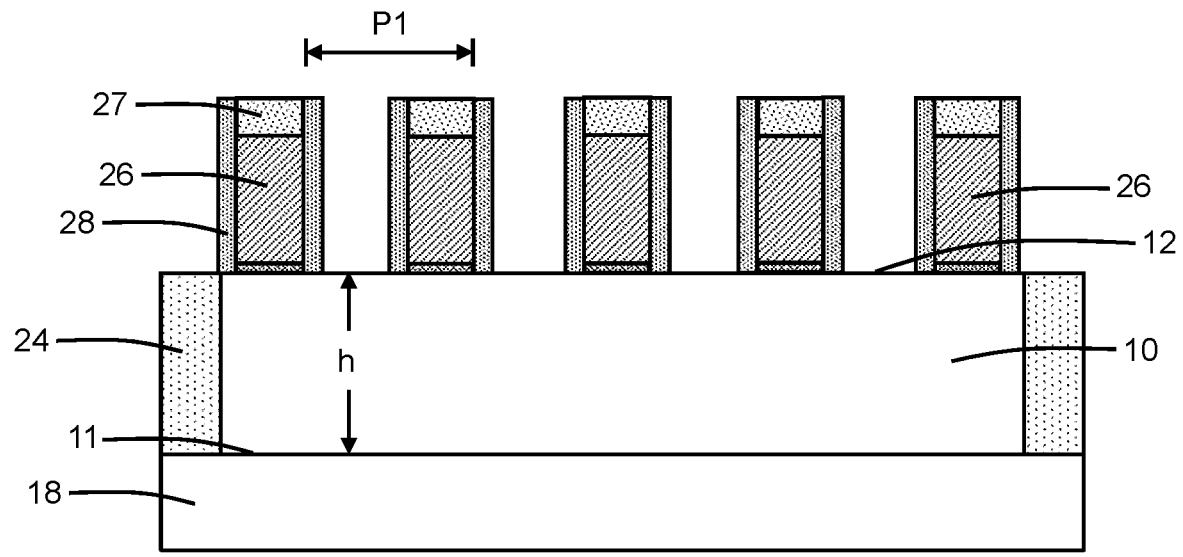
FIG. 2 is a cross-sectional view taken generally along line 2-2 in FIG. 1.

With reference to FIGS. 1, 2 and in accordance with embodiments of the invention, fins 10, 12 are formed that project from a top surface 11 of a substrate 18. The fins 10 have respective top surfaces 14 and the fins 12 have respective top surfaces 16, and the top surfaces 14, 16 may be located at a height, h, relative to the top surface 11 of the substrate 18. The fins 10, 12 and the substrate 18 may be comprised of a single-crystal semiconductor material, such as single-crystal silicon. The fins 10, 12 may be patterned from the substrate 18 using lithography and etching processes. In an embodiment, the fins 10 and the fins 12 may be concurrently patterned. The fins 10 may be arranged in a device region 20 of the substrate 18, and the fins 12 may be arranged in a device region 22 of the substrate 18. In an embodiment, the fins 10 in the device region 20 and the fins 12 in the device region 22 may be used to construct fin-type field-effect transistors. In an embodiment, the fins 10 in the device region 20 and the fins 12 in the device region 22 may be used to construct a diode for an electrostatic discharge circuit.

Shallow trench isolation 24 may be formed that surrounds the fins 10, 12. The shallow trench isolation 24 may be composed of a dielectric material, such as silicon dioxide, deposited by chemical vapor deposition or grown by thermal oxidation, and may be etched back following deposition to reveal the fins 10, 12. A well (not shown) may be formed in the substrate 18 by ion implanting a concentration of a dopant species, such as an n-type dopant, and activating the dopant species by thermal annealing.

Gate structures 26 are formed that extend transversely across the fins 10 and transversely across the fins 12 with a lateral spacing. The gate structures 26 may include an upper layer comprised of a conductor, such as polycrystalline silicon (i.e., polysilicon), and lower layer composed of an electrical insulator, such as silicon dioxide. A deposited layer stack including the upper and lower layers may be patterned by lithography and etching processes to define the gate structures 26. Each gate structure 26 may include a cap 27 comprised of a dielectric material, such as silicon nitride, that is a remnant of their formation. The gate structures 26 may be dummy gate structures that are subsequently replaced in a replacement-metal-gate process. The gate structures 26 may be arranged parallel or substantially parallel to each other. The gate structures 26 have an arrangement that is characterized by a lateral spacing given by a pitch, P1, which may be a one times (1×) contacted poly pitch (CPP) arrangement.

Sidewall spacers 28 are formed that respectively surround a sidewall of each gate structure 26. The sidewall spacers 28 may be formed by depositing a conformal layer composed of a dielectric material and etching the deposited conformal layer with an anisotropic etching process, such as reactive ion etching. The sidewall spacers 28 may be comprised of a low-k dielectric material (e.g., hydrogen-enriched silicon oxycarbide (SiCOH)) characterized by a relative permittivity or dielectric constant that is less than the dielectric constant (i.e., approximately 3.9) of silicon dioxide.

Figure 3:
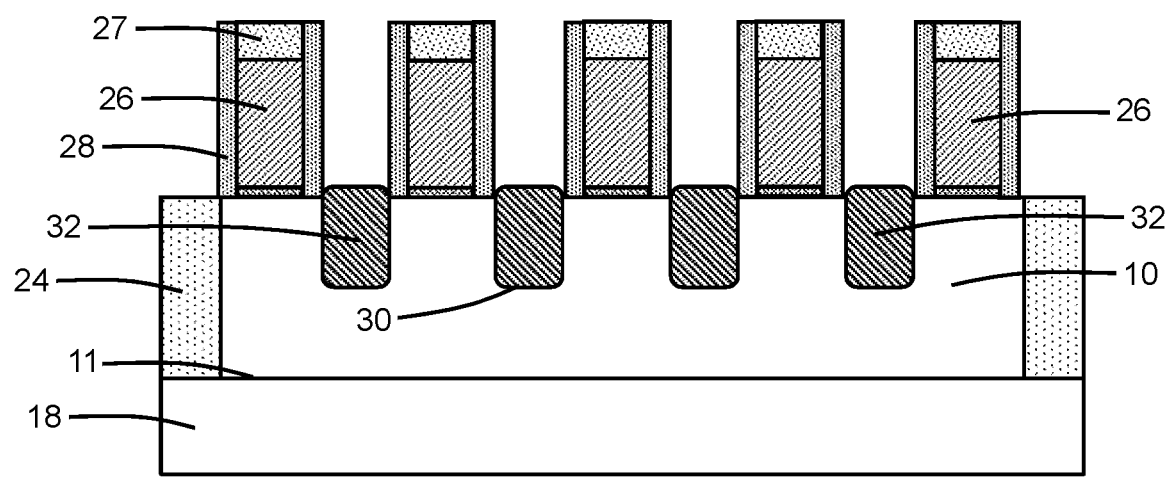
FIG. 3 is a cross-sectional view of the structure at a fabrication stage of the processing method subsequent to FIG. 2.

With reference to FIG. 3 in which like reference numerals refer to like features in FIG. 2 and at a subsequent fabrication stage of the processing method, cavities 30 are formed in the fins 10 and in the fins 12 by an etching process, such as an anisotropic etching process (e.g., reactive ion etching), that is self-aligned by the gate structures 26 and sidewall spacers 28. A layer 32 of a semiconductor material is grown in sections by an epitaxial growth process from the surfaces of the fins 10, 12 bordering each of the cavities 30. A separate section of the semiconductor layer 32 is positioned in each of the cavities 30. As a result, the sections of the semiconductor layer 32 are disconnected and distinct (i.e., detached).

The epitaxial growth process may be selective in that the semiconductor material does not grow from dielectric surfaces, such as the surfaces of the shallow trench isolation 24, the caps 27, and the sidewall spacers 28. The sections of the semiconductor layer 32 in device region 20 may be doped after epitaxial growth by, for example, a masked ion implantation to introduce a dopant (e.g., phosphorus and/or arsenic) that provides n-type electrical conductivity. The sections of the semiconductor layer 32 in device region 22 may be doped after epitaxial growth by, for example, a masked ion implantation to introduce a dopant (e.g., boron) that provides p-type electrical conductivity. The sections of the semiconductor layer 32 may define source/drain regions of a field-effect transistor. As used herein, the term "source/drain region" means a doped volume of semiconductor material that can function as either a source or a drain of a field-effect transistor.

The cavities 30 may exhibit an improvement in filling by the epitaxial semiconductor material of the semiconductor layer 32 in comparison with conventional processes having a wider gate pitch at the time of filling and exhibiting cavity underfilling. The cavities 30 and sections of the semiconductor layer 32 are formed with a 1×CPP arrangement for the gate structures 26. The cavities 30 are volumetrically smaller than in conventional processes characterized by a large gate pitch (e.g., a 2×CPP arrangement) at the time of cavity formation. The cavities 30 therefor define comparatively small volumes to be filled by the sections of the semiconductor layer 32. The semiconductor material contained in the multiple sections of the semiconductor layer 32 between adjacent gate structures in the completed device structure may be overall larger due to alleviation of cavity underfilling. The related gouging of the epitaxial semiconductor material during the subsequent formation of source/drain contacts may also be reduced.

Figure 4:
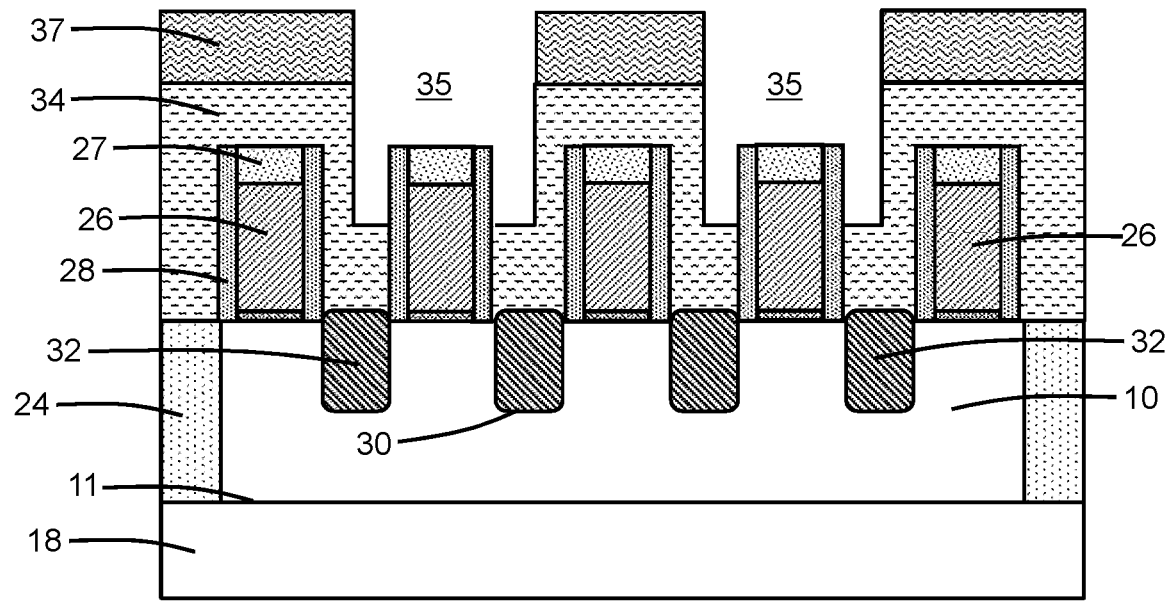
FIG. 4 is a cross-sectional view of the structure at a fabrication stage of the processing method subsequent to FIG. 3.

With reference to FIG. 4 in which like reference numerals refer to like features in FIG. 3 and at a subsequent fabrication stage of the processing method, a patterned hardmask 34 may be formed that includes openings 35. The hardmask 34 may include a spin-on hardmask material that is applied by a spin-on process and patterned by lithography and etching processes to define the openings 35. To that end, a layer 37 comprised of, for example, an organic photoresist may be applied by a spin coating process, pre-baked, exposed to light projected through a photomask, baked after exposure, and developed with a chemical developer to define openings at the intended locations of the openings 35. The openings 35 in the hardmask 34 fully reveal every other gate structure 26 (i.e., every second gate structure 26 or alternating gate structures 26) in the arrangement of gate structures 26. The layer 37 may be removed after forming the openings 35 in the hardmask 34.

Figure 5:
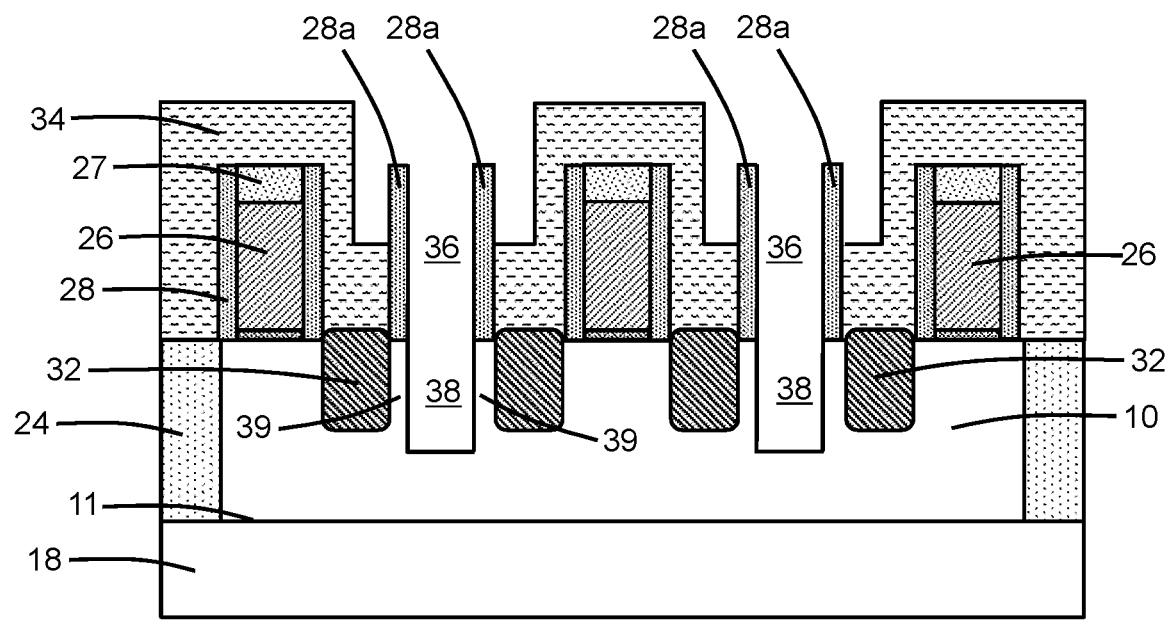
FIG. 5 is a cross-sectional view of the structure at a fabrication stage of the processing method subsequent to FIG. 4.
Figure 5A:
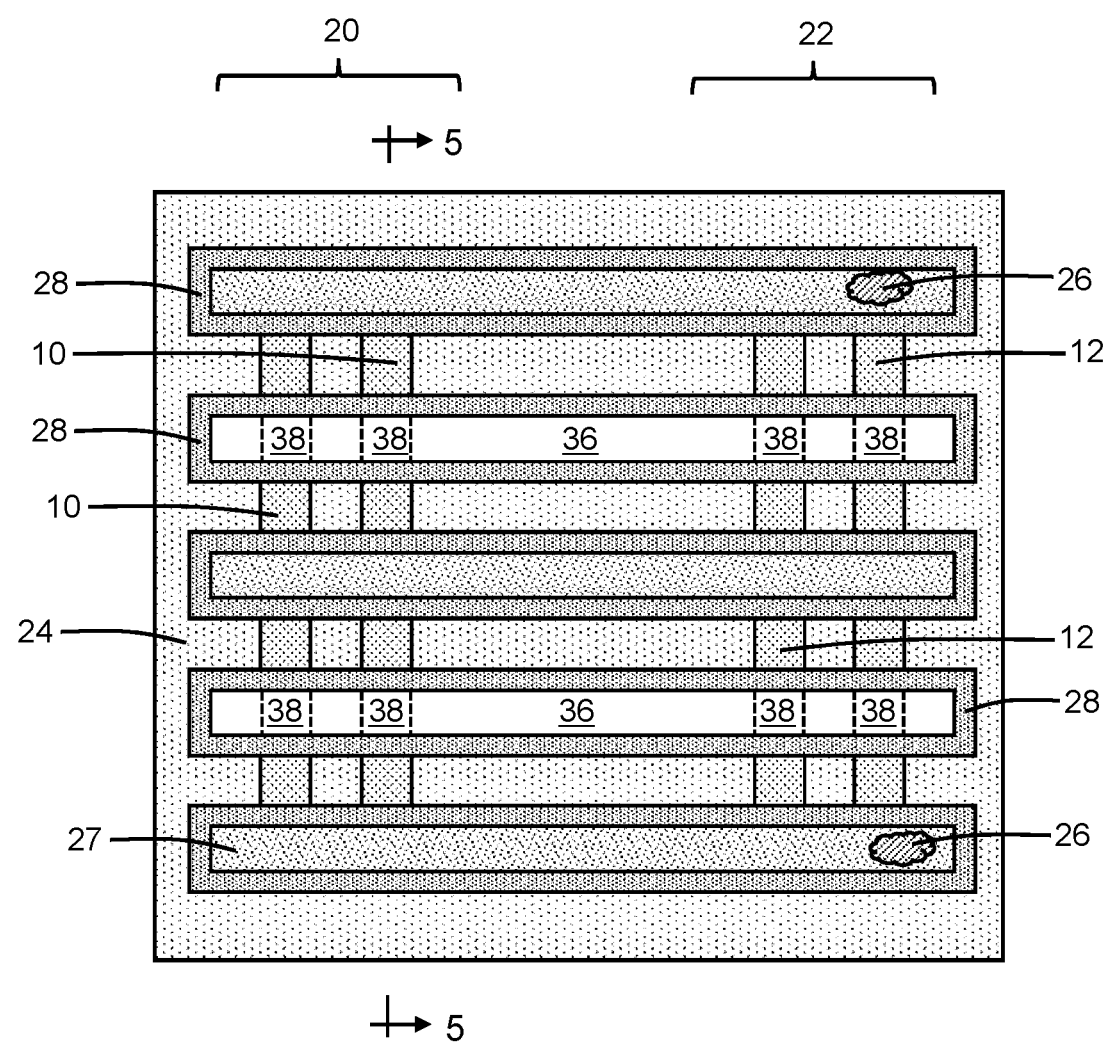

With reference to FIG. 5, 5A in which like reference numerals refer to like features in FIG. 4 and at a subsequent fabrication stage of the processing method, the caps 27 over the alternating gate structures 26 revealed by the openings 35 in the hardmask 34 are etched and removed to reveal the alternating gate structures 26. The alternating gate structures 26 exposed by the removal of the caps 27 are then removed (i.e., pulled) with an etching process to form cavities 36. Respective areas on the top surfaces 14, 16 of the fins 10, 12 are exposed by the removal of the gate structures 26. The etching process that removes the gate structures 26 selective to the sidewall spacers 28 to define the cavities 36 may be a reactive ion etching process. As used herein, the terms "selective" and "selectivity" in reference to a material removal process (e.g., etching) denote that the material removal rate (i.e., etch rate) for the targeted material is higher than the material removal rate (i.e., etch rate) for at least another material exposed to the material removal. Each cavity 36 is laterally surrounded on all sides by one of the sidewall spacers 28, and each cavity 36 is laterally positioned between an intact pair of gate structures 26 that are covered by the hardmask 34 during the etching process.

Cavities 38 are formed in the fins 10 at the locations of the exposed areas on their top surfaces 14. Cavities 38 are formed in the fins 12 at the locations of the exposed areas on their top surfaces 16. Sections 28a of the sidewall spacer 28 are positioned on the top surfaces 14 of the fins 10, and each cavity 38 is laterally positioned in one of the fins 10 between a spaced-apart pair of the sections 28a of the sidewall spacer 28. Sections 28a of the sidewall spacer 28 are also positioned on the top surfaces 16 of the fins 12, and each cavity 38 is laterally positioned in one of the fins 12 between a spaced-apart pair of the sections 28a of the sidewall spacer 28. In an embodiment, each cavity 38 may be centered between the pair of sections 28a of the sidewall spacer 28.

The cavities 38 in the fins 10, 12 may be formed by a self-aligned selective etching process, such as a reactive ion etching process. In an embodiment, the same etching process may be employed to form the cavities 36 and the cavities 38. The hardmask 34 may be removed after the cavities 36, 38 are formed.

Multiple cavities 38 are associated with each of the cavities 36. Each individual cavity 36 intersects with cavities 38 in the fins 10 in device region 20 and intersects with cavities 38 in the fins 12 in device region 22. A portion of cavity 36 is positioned directly over each cavity 38, a portion of cavity 36 is positioned adjacent to one side of each cavity 38, and a portion of cavity 36 is positioned adjacent to an opposite side of each cavity 38. Sections 28a of the sidewall spacer 28 are positioned adjacent to the portion of cavity 36 positioned directly over each cavity 38. Other sections of the sidewall spacer 28 are positioned adjacent to the portions of cavity 36 positioned adjacent to each cavity 38.

The cavities 38 may have a depth relative to the top surface 14 of the fins 10 and relative to the top surface 16 of the fins 12 that is greater than the depth of the cavities 30 holding the sections of the semiconductor layer 32. The greater depth places the bottoms of the cavities 38 closer to the top surface 11 of the substrate 18 than the bottoms of the cavities 30. Each of the fins 10, 12 includes portions 39 that are respectively positioned between each section of the semiconductor layer 32 and the adjacent cavity 38. The portions 39 result from the self-aligned masking of the fins 10, 12 by the sidewall spacers 28 during the etching process forming the cavities 38.

Figure 6:
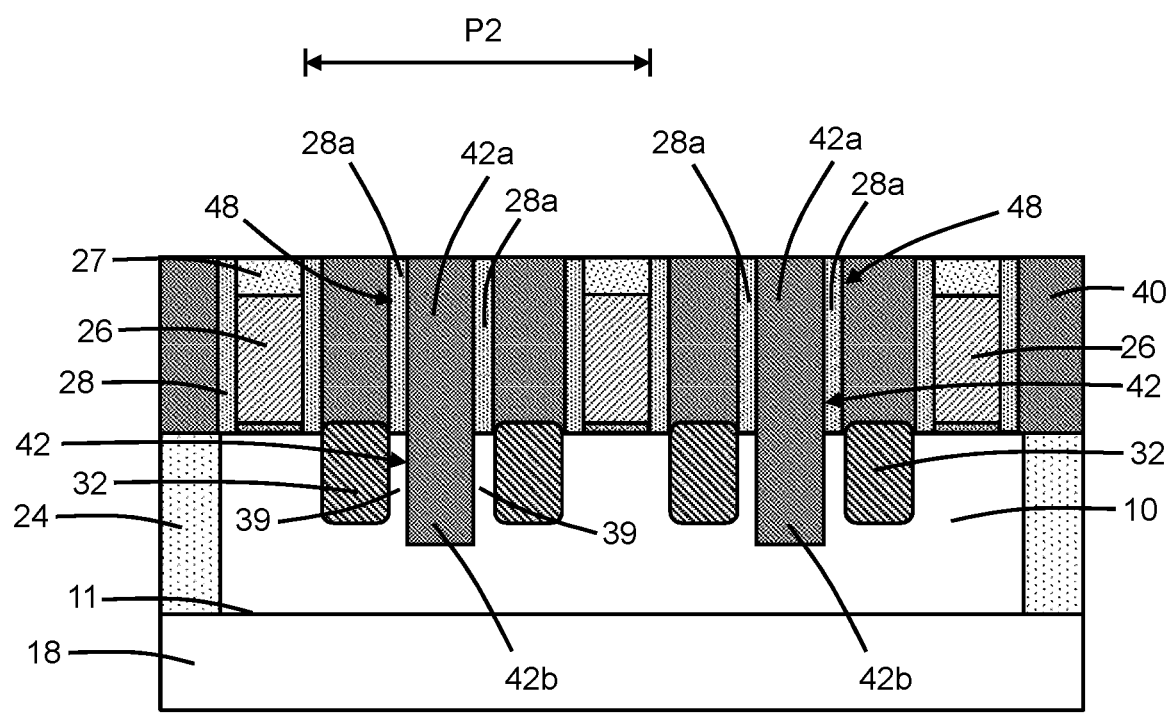
FIG. 6 is a cross-sectional view of the structure at a fabrication stage of the processing method subsequent to FIG. 5.
Figure 6A:
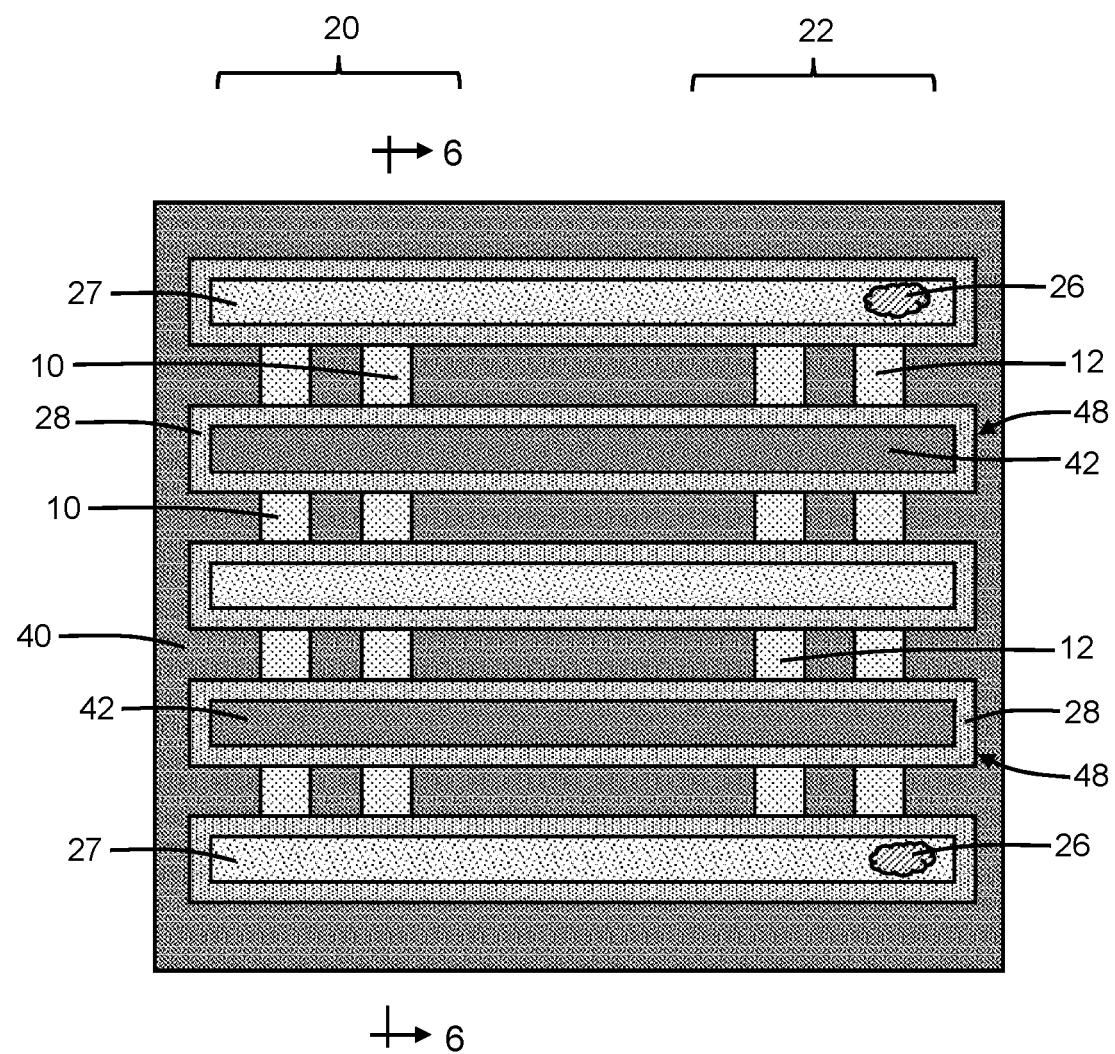

With reference to FIGS. 6, 6A in which like reference numerals refer to like features in FIGS. 5, 5A and at a subsequent fabrication stage of the processing method, isolation structures 48 are formed in the cavities 36, 38. Each isolation structure 48 includes one of the sidewall spacers 28 and a dielectric layer 42 with a lateral boundary defined by one of the sidewall spacers 28. In an embodiment, the sidewall spacer 28 of each isolation structure 48 is a closed shape surrounding the dielectric layer 42 to define the lateral boundary. The dielectric layer 42 includes portions 42a laterally positioned between respective spaced-apart pairs of the sections 28a of the sidewall spacer 28, portions 42b that are positioned in the cavities 38 in the fins 10, and portions 42b that are positioned in the cavities 38 in the fins 12. Each portion 42a may be positioned directly and seamlessly over one of the portions 42b.

A dielectric layer 40 is also formed in the spaces surrounding the gate structures 26 and over the sections of the semiconductor layer 32. The dielectric layers 40, 42 may be comprised of a dielectric material, such as silicon dioxide, that is deposited by chemical vapor deposition and planarized by chemical-mechanical polishing. The dielectric layers 40, 42 may be concurrently formed and have the same composition. Prior to depositing the dielectric layers 40, 42, a contact etch-stop layer (not shown) comprised of, for example, silicon nitride may be deposited to provide a conformal liner. Each sidewall spacer 28 provides self-alignment for the formation of each dielectric layer 42 during deposition. The composition of the dielectric material contained in the dielectric layers 40, 42 differs from the composition of the dielectric material contained in the sidewall spacers 28.

The dielectric layer 42 in each cavity 36 is separated from the dielectric layer 40 in the spaces around the isolation structures 48 by one of the sidewall spacers 28. The dielectric layer 42 in each cavity 36 may be surrounded on all sides by one of the sidewall spacers 28. Each portion 42a of the dielectric layer 42 is laterally positioned in one lateral direction (e.g., the x-direction in an x-y plane) between adjacent sections 28a of one of the sidewall spacers 28. Each portion 42b of the dielectric layer 42 is laterally positioned in one lateral direction (e.g., the x-direction in an x-y plane) between adjacent sections of the semiconductor layer 32. The portions 39 of the fins 10, 12 are positioned between these adjacent sections of the semiconductor layer 32 and the portion 42b of the dielectric layer 42 in each cavity 38. In an embodiment, each portion 42b of the dielectric layer 42 may be centered between the pair of sections 28a of the sidewall spacer 28. The portion 42b of the dielectric layer 42 in each cavity 38 is laterally positioned in the other lateral direction (e.g., the y-direction in an x-y plane) between other portions of the dielectric layer 42.

The dielectric layers 42 of the isolation structures 48 are late-formed after the gate structures 26 and the sections of the semiconductor layer 32 are formed. The isolation structures 48 may define single diffusion breaks in the fins 10, 12 that provide electrical isolation. The formation of the isolation structures 48 differs from conventional processes in which fin cuts for single diffusion breaks are formed before the gate structures 26 are formed.

Figure 7:
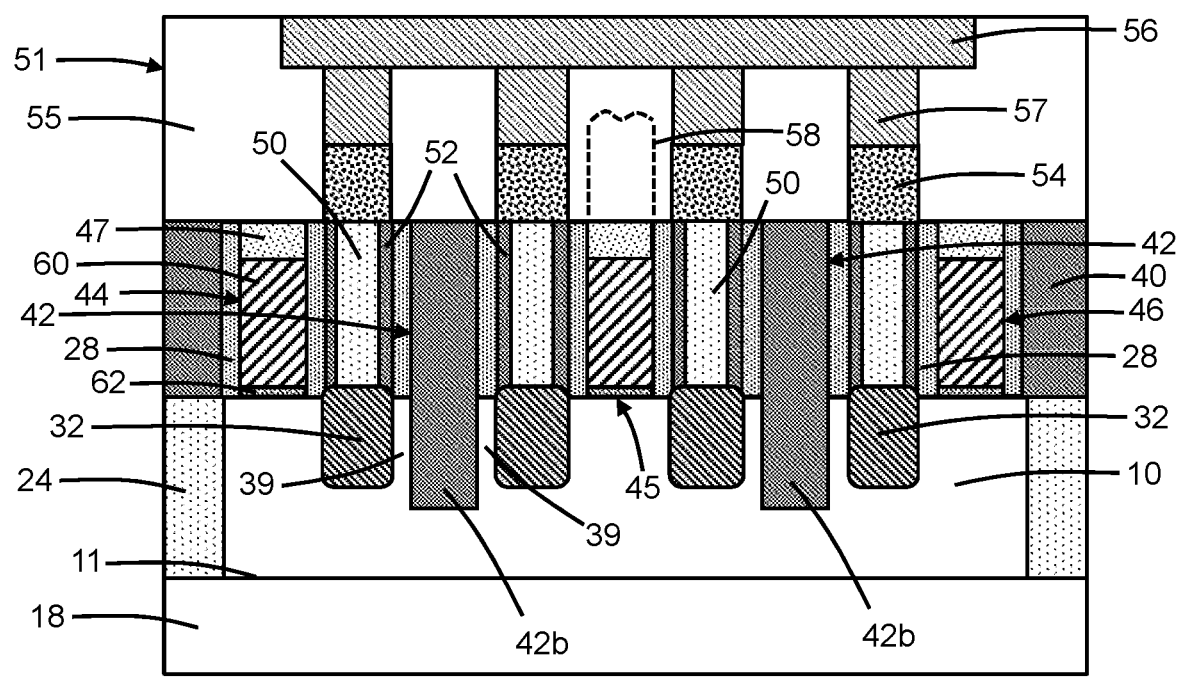
FIG. 7 is a cross-sectional view of the structure at a fabrication stage of the processing method subsequent to FIG. 6.

With reference to FIG. 7 in which like reference numerals refer to like features in FIG. 6 and at a subsequent fabrication stage of the processing method, a replacement metal gate process may be performed to replace the gate structures 26 with gate structures 44, 45, 46. The gate structures 44, 45, 46 may include a gate electrode 60 containing one or more metal gate materials, such as work function metals, and a gate dielectric 62 containing a dielectric material, such as a high-k dielectric material like hafnium oxide. Each of the gate structures 44, 45, 46 may be covered by a cap 47 comprised of, for example, silicon nitride. The gate structures 44, 45, 46 are each surrounded by one of the sidewall spacers 28, as are the dielectric layers 42 of the isolation structures 48.

Multiple sections of the semiconductor layer 32 are laterally positioned between the gate structure 44 and the gate structure 45. One of the isolation structures 48 is laterally positioned between gate structure 44 and the gate structure 45 and is also laterally positioned between the section of the semiconductor layer 32 adjacent to the gate structure 44 and the section of the semiconductor layer 32 adjacent to the gate structure 45.

Multiple sections of the semiconductor layer 32 are laterally positioned between the gate structure 45 and the gate structure 46. One of the isolation structures 48 is laterally positioned between gate structure 45 and the gate structure 46 and is also laterally positioned between the section of the semiconductor layer 32 adjacent to the gate structure 45 and the section of the semiconductor layer 32 adjacent to the gate structure 46.

Source/drain contacts 50 may be formed in contact openings defined by lithography and etching processes in an interlayer dielectric layer 52. The source/drain contacts 50 may contain a metal silicide, such as tungsten silicide, titanium silicide, nickel silicide, or cobalt silicide, formed by silicidation. The interlayer dielectric layer 52 may be comprised of a dielectric material, such as silicon dioxide. The source/drain contacts 50 are connected to the sections of the semiconductor layer 32. Portions of the interlayer dielectric layer 52 are laterally arranged in the space between the sidewall spacers 28 and the source/drain contacts 50.

An interconnect structure 51 is formed by middle-of-line and back-end-of-line processing that includes formation of upper contacts 54 connected to the source/drain contacts 50 and wiring 56 connected by vias 57 with the upper contacts 54. The upper contacts 54, wiring 56, and vias 57 may be formed in one or more interlayer dielectric layers 55. The gate structure 45 may be physically connected by one or more contacts 58 and one or more vias with other wiring (not shown). The gate structure 44 and the gate structure 46 represent dummy gates that lack electrical and physical connections to the interconnect structure 51.

In the device structure, the isolation structures 48 define an elongated dielectric bar that is arranged between adjacent gate structures 44, 45 and another elongated dielectric bar that is arranged between adjacent gate structures 45, 46. The gate structures 44, 45, 46 in the device structure have a lateral spacing with a pitch, P2, providing a multiple CPP arrangement that is established after the sections of the semiconductor layer 32 are epitaxially grown. In the representative embodiment, the multiple CPP arrangement is a 2×CPP arrangement.

In an embodiment, the sections of the semiconductor layer 32 may be connected by the wiring 56 in the interconnect structure 51 to define a diode for an electrostatic discharge (ESD) circuit. The parasitic capacitance of the ESD diode is reduced by reducing the dummy gate density and replacing pulled gate structures 26 with isolation structures 48. The dummy gate density is reduced after forming the sections of the semiconductor layer 32 and, in the completed device structure, the on-resistance of the ESD diode is improved due to the associated improvement in the quality of the sections of the semiconductor layer 32.

Figure 8:
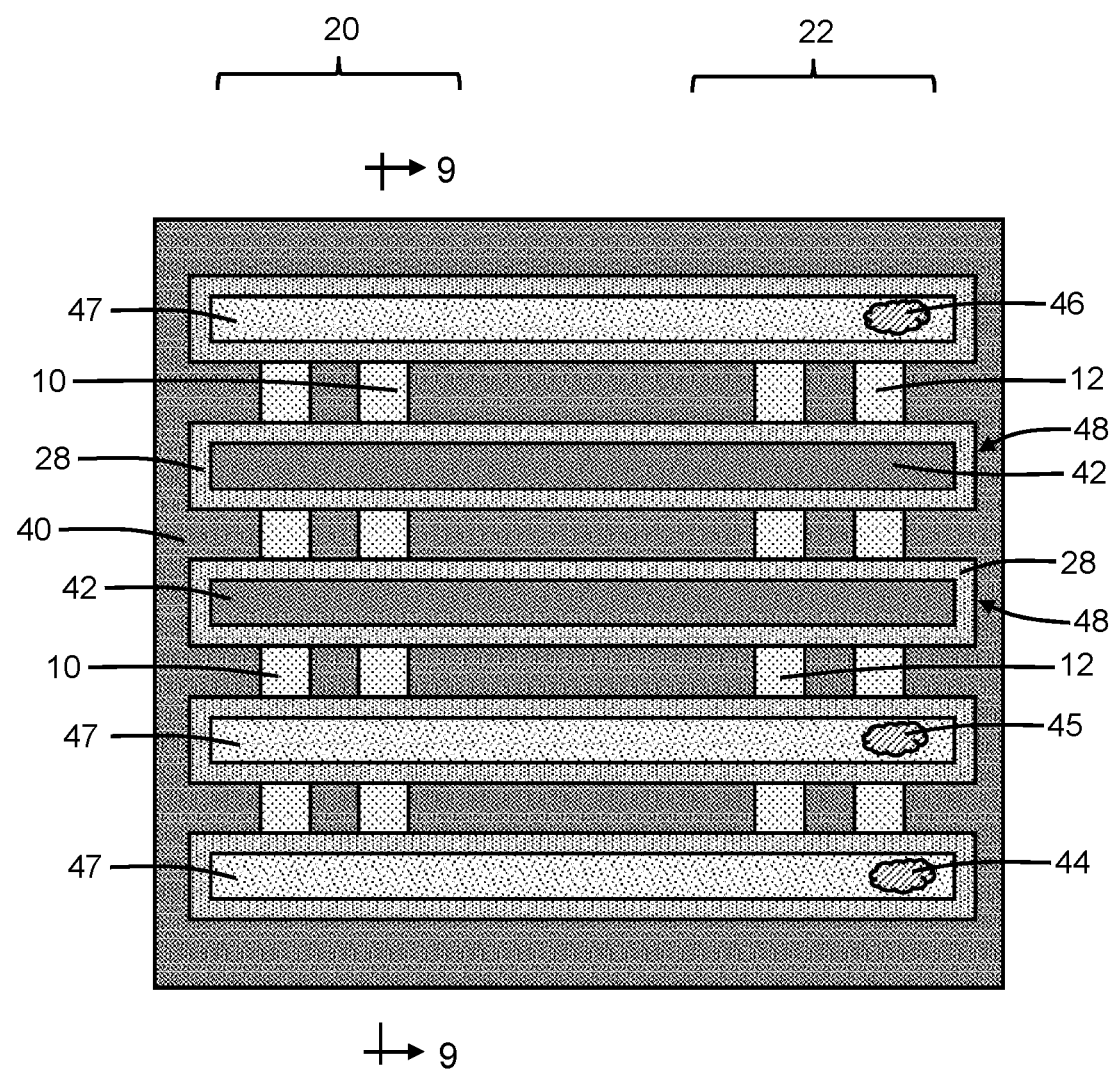
FIG. 8 is a top view of a structure in accordance with alternative embodiments of the invention.
Figure 9:
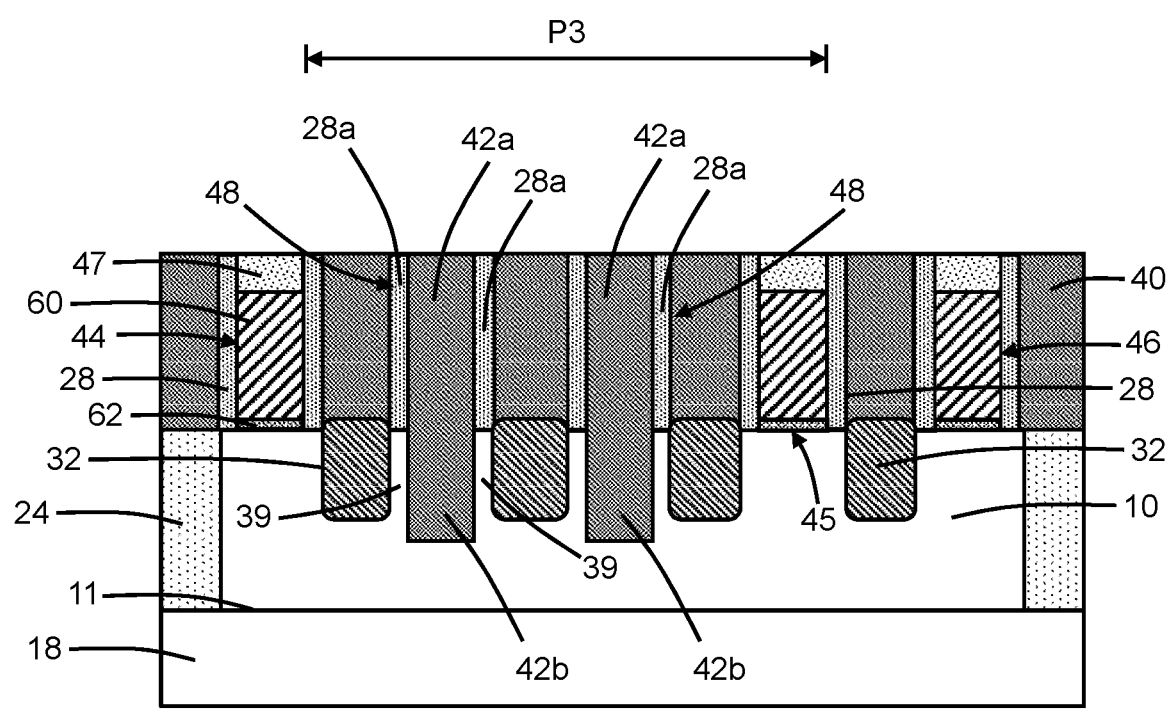
FIG. 9 is a cross-sectional view taken generally along line 9-9 in FIG. 8.

With reference to FIGS. 8, 9 and in accordance with alternative embodiments, a pair of adjacent gate structures 26 may be removed and replaced with the dielectric layers 42. The gate structures 44, 45, 46, when formed, will have a larger pitch, in this embodiment 3×CPP, than embodiments in which alternating gate structures 26 are removed and replaced by the dielectric layers 42. Processing continues as described in connection with FIG. 7 to form the source/drain contacts 50, the interconnect structure 51, and the interlayer dielectric layer 52.

Figure 10:
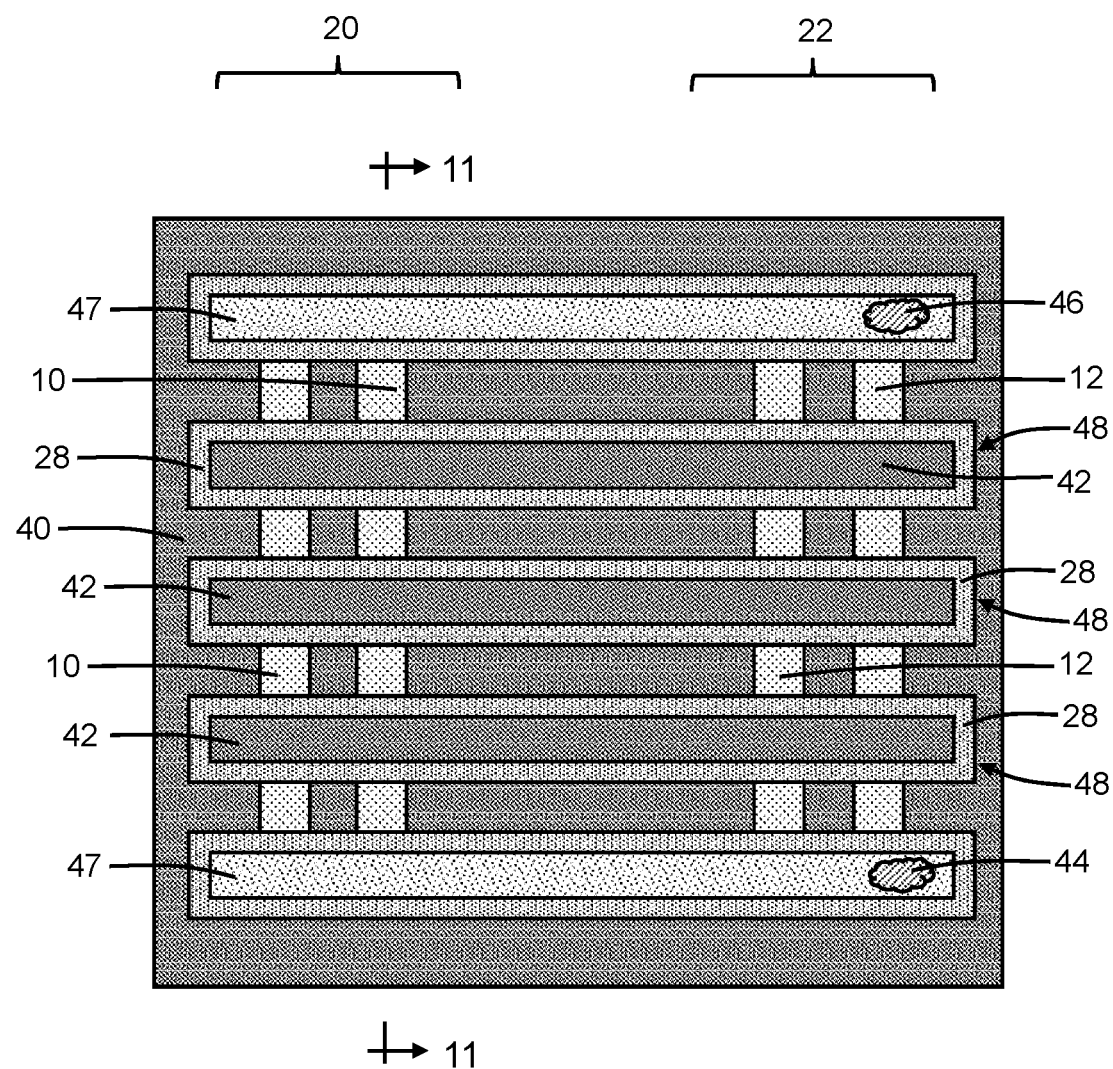
FIG. 10 is a top view of a structure in accordance with alternative embodiments of the invention.
Figure 11:
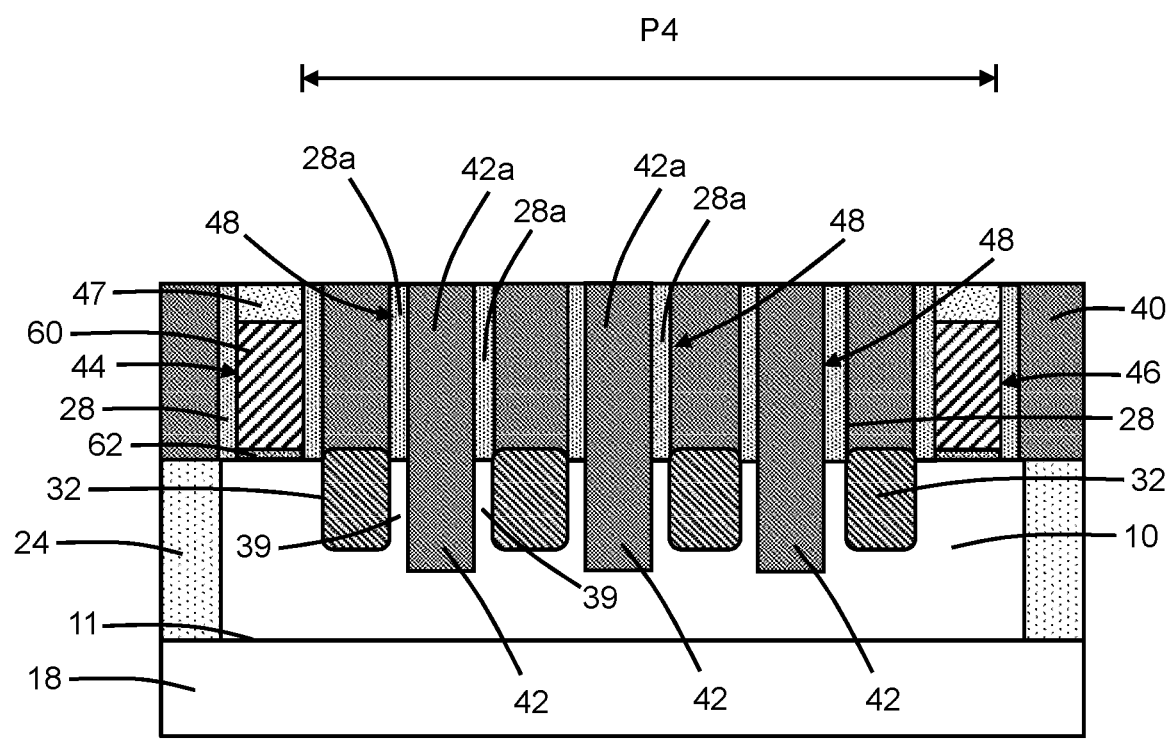
FIG. 11 is a cross-sectional view taken generally along line 11-11 in FIG. 10.

With reference to FIGS. 10, 11 and in accordance with alternative embodiments, more than two (e.g., three) adjacent gate structures 26 may be removed and replaced with the dielectric layers 42. The gate structures 44, 46, when formed as described in connection with FIG. 7, will have a larger pitch, in this embodiment 4×CPP, than embodiments in which alternating gate structures 26 are removed and replaced by the dielectric layers 42. Processing continues as described in connection with FIG. 7 to form the source/drain contacts 50, the interconnect structure 51, and the interlayer dielectric layer 52.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a first semiconductor fin including a top surface, a first cavity, a second cavity, and a third cavity laterally positioned between the first cavity and the second cavity;
   a first gate structure and a second gate structure extending over the first semiconductor fin, the first gate structure adjacent to the second gate structure;
   a first semiconductor layer including a first section in the first cavity and a second section in the second cavity, the first section of the first semiconductor layer laterally positioned between the third cavity and the first gate structure, and the second section of the first semiconductor layer laterally positioned between the third cavity and the second gate structure;
   a shallow trench isolation region positioned in the first semiconductor fin adjacent to the second gate structure; and a first isolation structure laterally positioned between the first section and the second section of the first semiconductor layer, the first isolation structure including a first dielectric layer and a first sidewall spacer, the first sidewall spacer having a first section and a second section, the first section and the second section of the first sidewall spacer positioned on the top surface of the first semiconductor fin, and the first dielectric layer including a first portion in the third cavity and a second portion between the first section and the second section of the first sidewall spacer, wherein the first semiconductor fin includes a first portion laterally between the first cavity and the first portion of the first dielectric layer, the first semiconductor fin includes a second portion laterally between the second cavity and the second portion of the first dielectric layer, the second gate structure extends across a third portion of the first semiconductor fin, the third cavity extends to a depth relative to the top surface of the first semiconductor fin that is greater than the depth of the first cavity and the second cavity, and the second section of the first semiconductor layer, the second portion of the first semiconductor fin, and the third portion of the first semiconductor fin are positioned between the first isolation structure and the shallow trench isolation region.

2. The structure of claim 1 wherein the semiconductor body is a semiconductor fin.

3. The structure of claim 1 further comprising:
a third gate structure on the first semiconductor fin; and
an interconnect structure including a contact physically connected to the first gate structure,
wherein the first gate structure is laterally positioned between the second gate structure and the third gate structure.

4. The structure of claim 3 wherein the second gate structure and the third gate structure lack connections to the interconnect structure.

5. The structure of claim 1 wherein and the third cavity is centered between the first section of the first sidewall spacer and the second section of the first sidewall spacer.

6. The structure of claim 1 wherein the first semiconductor fin includes a fourth cavity, and further comprising:
a second isolation structure including a second dielectric layer and a second sidewall spacer, the second sidewall spacer having a first section and a second section, and the second dielectric layer including a first portion in the fourth cavity and a second portion between the first section and the second section of the second sidewall spacer.

7. The structure of claim 1 wherein the first sidewall spacer comprises a first material, and the first dielectric layer comprises a second material having a different composition than the first material.

8. The structure of claim 7 wherein the first gate structure and the second gate structure each contain one or more work function metals, the first material is a low-k dielectric material, and the second material is silicon dioxide.

9. The structure of claim 1 wherein the second portion of the first dielectric layer extends in a lateral direction from the first section of the first sidewall spacer to the second section of the first sidewall spacer.

10. The structure of claim 9 wherein the second portion of the first dielectric layer is positioned directly over the first portion of the first dielectric layer.

11. The structure of claim 1 wherein the second portion of the first dielectric layer is positioned directly over the first portion of the first dielectric layer.

12. The structure of claim 1 wherein the first semiconductor fin is free of the first semiconductor layer in a space between the third portion of the first semiconductor fin and the shallow trench isolation region.

13. The structure of claim 1 further comprising:
an interconnect structure including a contact physically connected to the first gate structure,
wherein the second gate structure lacks a connection to the interconnect structure.

14. The structure of claim 1 further comprising:
a second semiconductor fin including a first cavity;
a second semiconductor layer including a first section in the first cavity; and
an interconnect structure including wiring connecting the first section of the first semiconductor layer and the first section of the second semiconductor layer.

15. The structure of claim 14 wherein the second semiconductor fin includes a second cavity and a third cavity laterally positioned between the first cavity and the second cavity, the second semiconductor layer includes a second section in the second cavity, and further comprising:
a second isolation structure laterally positioned between the first section and the second section of the second semiconductor layer, the second isolation structure comprising a dielectric material in the third cavity.

16. The structure of claim 1 wherein the second portion of the first dielectric layer is positioned directly and seamlessly over the first portion of the first dielectric layer.

17. A method comprising:
forming a first cavity, a second cavity, and a third cavity in a semiconductor fin, wherein the third cavity is laterally positioned between the first cavity and the second cavity;
forming a first gate structure and a second gate structure extending over the semiconductor fin;
forming a first section of a semiconductor layer in the first cavity and a second section of the semiconductor layer in the second cavity;
forming a shallow trench isolation region positioned in the semiconductor fin adjacent to the second gate structure; and
forming an isolation structure laterally positioned between the first section and the second section of the semiconductor layer,
wherein the first gate structure is adjacent to the second gate structure, the first section of the semiconductor layer is laterally positioned between the third cavity and the first gate structure, the second section of the semiconductor layer is laterally positioned between the third cavity and the second gate structure, the isolation structure includes a dielectric layer and a sidewall spacer, the sidewall spacer has a first section and a second section, the dielectric layer includes a first portion in the third cavity and a second portion between the first section and the second section of the sidewall spacer, the semiconductor fin includes a first portion laterally between the first cavity and the first portion of the dielectric layer, the semiconductor fin includes a second portion laterally between the second cavity and the second portion of the dielectric layer, the second gate structure extends across a third portion of the semiconductor fin, the third cavity extends to a depth relative to a top surface of the semiconductor fin that is greater than the depth of the first cavity and the second cavity, and the second section of the semiconductor layer, the second portion of the semiconductor fin, and the third portion of the semiconductor fin are positioned between the isolation structure and the shallow trench isolation region.

18. The method of claim 17 wherein the first section and the second section of the semiconductor layer are concurrently formed by an epitaxial growth process.

19. The method of claim 17 wherein the second portion of the dielectric layer is positioned directly over the first portion of the dielectric layer.

* * * * *

UNITED STATES PATENT AND TRADEMARK OFFICE
CERTIFICATE OF CORRECTION

PATENT NO. : 11,908,857 B2
APPLICATION NO. : 16/901417
DATED : February 20, 2024
INVENTOR(S) : Yanping Shen, Haiting Wang and Sipeng Gu Page 1 of 1

It is certified that error appears in the above-identified patent and that said Letters Patent is hereby corrected as shown below:

In the Claims

Column 9, Claim 5, Line 41 reads:
"5. The structure of claim 1 wherein and the third cavity is"
It should read:
--5. The structure of claim 1 wherein the third cavity is--

Signed and Sealed this
Twenty-sixth Day of November, 2024

Katherine Kelly Vidal
*Director of the United States Patent and Trademark Office*